United States Patent
Lin et al.

(10) Patent No.: US 9,620,601 B2
(45) Date of Patent: Apr. 11, 2017

(54) CONTACT STRUCTURES AND METHODS OF FORMING THE SAME

(71) Applicant: Taiwan Semiconductor Manufacturing Company, Ltd., Hsin-Chu (TW)

(72) Inventors: Yu-Hung Lin, Taichung (TW); Sheng-Hsuan Lin, Zhubei (TW); Chih-Wei Chang, Hsin-Chu (TW); You-Hua Chou, Hsin-Chu (TW); Chia-Lin Hsu, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 184 days.

(21) Appl. No.: 14/321,366

(22) Filed: Jul. 1, 2014

(65) Prior Publication Data

US 2016/0005824 A1 Jan. 7, 2016

(51) Int. Cl.
*H01L 29/417* (2006.01)
*H01L 21/3205* (2006.01)
*H01L 21/285* (2006.01)
*H01L 29/66* (2006.01)
*H01L 23/485* (2006.01)
*H01L 21/768* (2006.01)
(Continued)

(52) U.S. Cl.
CPC .. *H01L 29/41791* (2013.01); *H01L 21/28518* (2013.01); *H01L 21/76843* (2013.01); *H01L 21/76855* (2013.01); *H01L 23/485* (2013.01); *H01L 29/66795* (2013.01); *H01L 21/0262* (2013.01); *H01L 21/02529* (2013.01); *H01L 21/02532* (2013.01); *H01L 21/02576* (2013.01); *H01L 23/53266* (2013.01); *H01L 2924/0002* (2013.01)

(58) Field of Classification Search
CPC ......... H01L 2924/0002; H01L 2924/00; H01L 21/76843; H01L 21/76855; H01L 21/76802; H01L 23/485
USPC ................... 438/653; 257/E21.296, E21.585
See application file for complete search history.

(56) References Cited

U.S. PATENT DOCUMENTS 5,899,741 A 5/1999 Tseng et al.
6,117,768 A 9/2000 Wu et al.
(Continued)

FOREIGN PATENT DOCUMENTS

KR 20010016923 A 3/2001
TW 363225 7/1999
(Continued)

*Primary Examiner* — David Vu
*Assistant Examiner* — Jonathan Han
(74) *Attorney, Agent, or Firm* — Slater Matsil, LLP

(57) ABSTRACT

Embodiments of the present disclosure include contact structures and methods of forming the same. An embodiment is a method of forming a semiconductor device, the method including forming a contact region over a substrate, forming a dielectric layer over the contact region and the substrate, and forming an opening through the dielectric layer to expose a portion of the contact region. The method further includes forming a metal-silicide layer on the exposed portion of the contact region and along sidewalls of the opening; and filling the opening with a conductive material to form a conductive plug in the dielectric layer, the conductive plug being electrically coupled to the contact region.

20 Claims, 10 Drawing Sheets

(51) Int. Cl.
*H01L 21/02* (2006.01)
*H01L 23/532* (2006.01)

(56) References Cited

U.S. PATENT DOCUMENTS

| | | |
|---|---|---|
| 6,294,420 B1 * | 9/2001 | Tsu .................. H01L 28/75 |
| | | 257/E21.009 |
| 6,376,368 B1 | 4/2002 | Jung et al. |
| 2003/0073304 A1 | 4/2003 | Mak et al. |
| 2005/0280118 A1 | 12/2005 | Lin et al. |
| 2007/0099370 A1 * | 5/2007 | Nakajima ......... H01L 21/28052 |
| | | 438/199 |
| 2007/0141837 A1 * | 6/2007 | Ryu .................. H01L 21/76814 |
| | | 438/672 |
| 2009/0280641 A1 | 11/2009 | Kang et al. |
| 2012/0161324 A1 | 6/2012 | Heinrich et al. |
| 2013/0137260 A1 * | 5/2013 | Alptekin .......... H01L 21/28518 |
| | | 438/664 |
| 2013/0200470 A1 | 8/2013 | Liu et al. |
| 2014/0154846 A1 | 6/2014 | Cheng et al. |
| 2014/0306291 A1 * | 10/2014 | Alptekin .......... H01L 29/41725 |
| | | 257/369 |

FOREIGN PATENT DOCUMENTS

| | | |
|---|---|---|
| TW | 559992 | 11/2003 |
| TW | 200707640 | 2/2007 |
| TW | I304635 | 12/2008 |
| TW | 201423907 | 6/2014 |

* cited by examiner

CONTACT STRUCTURES AND METHODS OF FORMING THE SAME

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

Conductive materials such as metals or semiconductors are used in semiconductor devices for making electrical connections for the integrated circuits. As devices have decreased in size, the requirements for the conductors and insulators have changed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
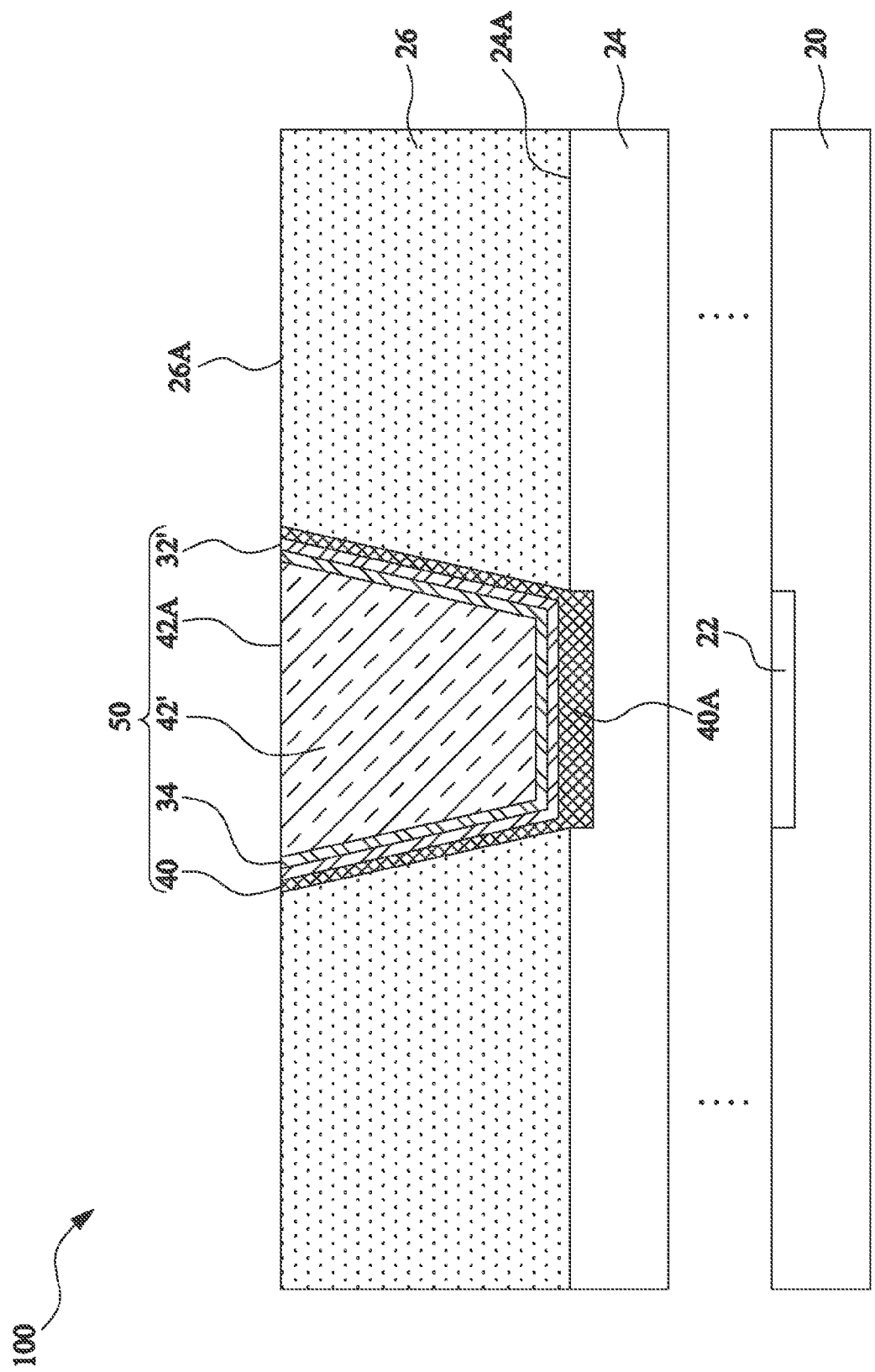
FIG. 1 illustrates a cross-sectional view of a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general terms, using embodiments of the present disclosure, semiconductor devices can leverage a low resistance silicide contact with improved process stability. In particular, the present disclosure forms the silicide in the contact opening after the contact opening is formed rather than forming the silicide before the contact is formed. In this process, a capping layer is formed inside the contact opening and a metal layer is formed over the capping layer. These layers are then annealed to form the silicide layer. By forming the capping layer after the contact opening is formed, the capping layer properties are not affected by the contact opening etching process, the dielectric layer formation, or any other processes performed before the capping layer formation. This improves the processing window for the capping layer formation and also improves the process stability for the contact formation. In addition, the capping layer can repair damage caused by the etching of the contact opening.

FIG. 1 illustrates a cross-sectional view of a semiconductor device 100 in accordance with some embodiments. The semiconductor device 100 includes a substrate 20, active or passive devices 22, a contact layer 24, a dielectric layer 26, and a contact structure 50. The contact structure includes a metal-silicide layer 40, an unreacted metal layer 32', a glue layer 34, and a conductive plug 42'.

The substrate 20 may be a part of a wafer and may include a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 20 may comprise a silicon-on-insulator (SOI) substrate. Generally, an SOI substrate comprises a layer of a semiconductor material such as epitaxial silicon, germanium, silicon germanium, SOI, silicon germanium on insulator (SGOI), or combinations thereof. The substrate 20 may be doped with a p-type dopant, such as boron, aluminum, gallium, or the like, although the substrate may alternatively be doped with an n-type dopant, as is known in the art.

The substrate 20 may include active and passive devices 22. As one of ordinary skill in the art will recognize, a wide variety of devices such as transistors, capacitors, resistors, combinations of these, and the like may be used to generate the structural and functional requirements of the design for the semiconductor device 100. The active and passive devices 22 may be formed using any suitable methods. Only a portion of the substrate 20 is illustrated in the figures, as this is sufficient to fully describe the illustrative embodiments.

A contact layer 24 is formed over the substrate 20. The contact layer 24 may include a doped region over the substrate 20. In some embodiments, the contact layer 24 is formed directly on or in a top surface of the substrate 20. The dielectric layer 26 is formed over the contact layer 24. The dielectric layer 26 may be formed of oxides such as silicon oxide, low-k dielectrics, polymers, the like, or a combination thereof.

The contact structure 50 is formed to extend through the dielectric layer 26 to the contact layer 24. The contact structure 50 may be formed in an opening in the dielectric layer 26 (see FIGS. 2A through 2F discussed below). The contact structure 50 includes the metal-silicide layer 40 directly adjoining the contact layer 24 and the dielectric layer 26. The metal-silicide layer 40 provides a low resistance contact to the contact layer 24 and good adhesion to the contact layer 24. In some embodiments, the metal-silicide layer 40 extends along substantially the entire sidewall of the contact structure 50 from the contact layer 24 to a top surface 26A of the dielectric layer 26. The metal-silicide layer 40 may have a surface of the portion 40A that extends lower than a top surface 24A of the contact layer 24 as some of the contact layer 24 may be consumed during the silicidation process to form the metal-silicide layer 40.

The unreacted metal layer 32' is on the metal-silicide layer 40. The unreacted metal layer 32' is the metal layer that was not consumed during the formation of the metal-silicide layer 40. In some embodiments, the unreacted metal layer 32' is not present as substantially the entire metal layer is consumed during the formation of the metal-silicide layer 40. The glue layer 34 is formed on the unreacted metal layer 32'. The glue layer 34 improves the adhesion between the subsequently formed conductive plug 42' and also prevents oxidation of the unreacted metal layer 32' (also the metal layer 32 before silicidation process in, for example, FIG. 2D).

The conductive plug 42' is formed on the glue layer 34 and may substantially fill the remaining portion of the opening in the dielectric layer 26. In some embodiments, the conductive plug 42' has a top surface 42A that is substantially coplanar with the top surface 26A of the dielectric layer 26.

Figure 2A:
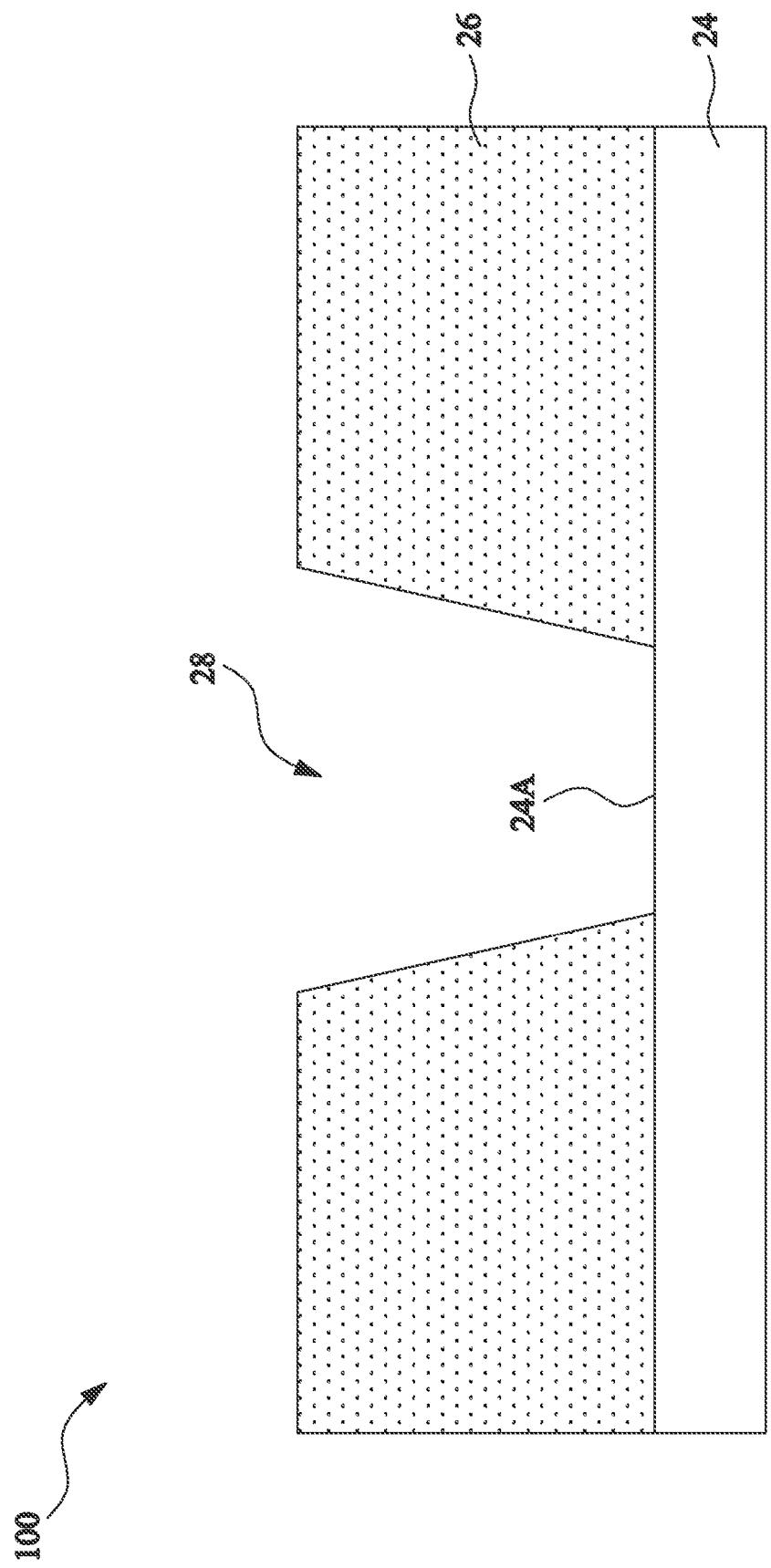
FIGS. 2A through 2G are cross-sectional views of intermediate stages in the manufacturing of a semiconductor device in accordance with some embodiments.
Figure 4:
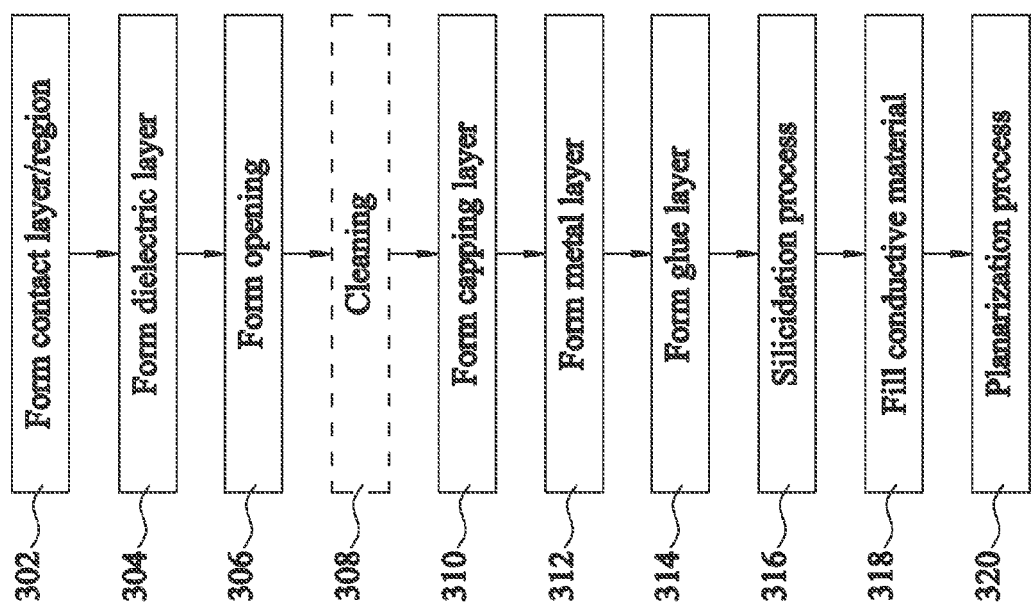
FIG. 4 illustrates a process flow diagram of the process shown in FIGS. 2A through 2G in accordance with some embodiments.

FIGS. 2A through 2G are cross-sectional views of intermediate stages in the manufacturing of the semiconductor device 100 in accordance with some embodiments and FIG. 4 is a process flow diagram of the process shown in FIGS. 2A through 2G. With reference to FIG. 2A, there is shown the semiconductor device 100 at an intermediate stage of processing including the contact layer 24, the dielectric layer 26, and an opening 28. Although not shown in FIG. 2A, the contact layer 24 can be formed over or on the substrate 20 (step 302).

The contact layer 24 may include a doped region over the substrate 20. The contact layer may be formed of silicon, silicon germanium, silicon phosphide, silicon carbide, the like, or a combination thereof. The contact layer 24 may be epitaxially grown from the substrate 20 or from some other intermediate structure. In some embodiments, the contact layer 24 is epitaxially grown in a recess formed in the substrate 20. In other embodiments, the contact layer 24 is formed by doping a portion of the substrate 20 with an implantation process. For example, the contact layer 24 may be a source region or a drain region of a transistor.

The dielectric layer 26 is formed over the contact layer 24 (step 304). The dielectric layer 26 may be formed of oxides such as silicon oxide, borophosphosilicate glass (BPSG), undoped silicate glass (USG), fluorinated silicate glass (FSG), low-k dielectrics such as carbon doped oxides, extremely low-k dielectrics such as porous carbon doped silicon dioxide, a polymer such as polyimide, the like, or a combination thereof. The low-k dielectric materials may have k values lower than 3.9. The dielectric layer 26 may be deposited by chemical vapor deposition (CVD), physical vapor deposition (PVD), atomic layer deposition (ALD), a spin-on-dielectric (SOD) process, the like, or a combination thereof. In some embodiments, the dielectric layer 26 is an inter-layer dielectric (ILD).

After the dielectric layer 26 is formed, an opening 28 may be formed through the dielectric layer 26 to a top surface 24A of the contact layer 24 (step 306). The opening 28 may be formed using acceptable photolithography and etching techniques such as, for example, an anisotropic dry etch.

In some embodiments, the formation of the opening includes a masking material such as a photoresist. In these embodiments, the photoresist (not shown) may be deposited and patterned over the dielectric layer. The photoresist may comprise a conventional photoresist material, such as a deep ultra-violet (DUV) photoresist, and may be deposited on the top surface of the dielectric layer 26, for example, by using a spin-on process to place the photoresist. However, any other suitable material or method of forming or placing the photoresist may alternatively be utilized. Once the photoresist has been formed, the photoresist may be exposed to energy, e.g. light, through a patterned reticle in order to induce a reaction in those portions of the photoresist exposed to the energy. The photoresist may then be developed, and portions of the photoresist may be removed forming openings in the photoresist, exposing portions of a top surface of dielectric layer 26 through the openings. After the photoresist is patterned, the dielectric layer 26 may be patterned to form the opening 28.

After the opening 28 is formed, an optional cleaning process may be performed to remove the native oxide or any residue from the etching process on the contact layer 24 (step 308). The cleaning process may be performed using an HCl solution, and the cleaning time may be about one minute, for example. In some embodiments, the native oxide can be avoided by maintaining the exposed contact layer 24 in a vacuum or in an oxygen or oxidizer free environment.

Figure 2B:
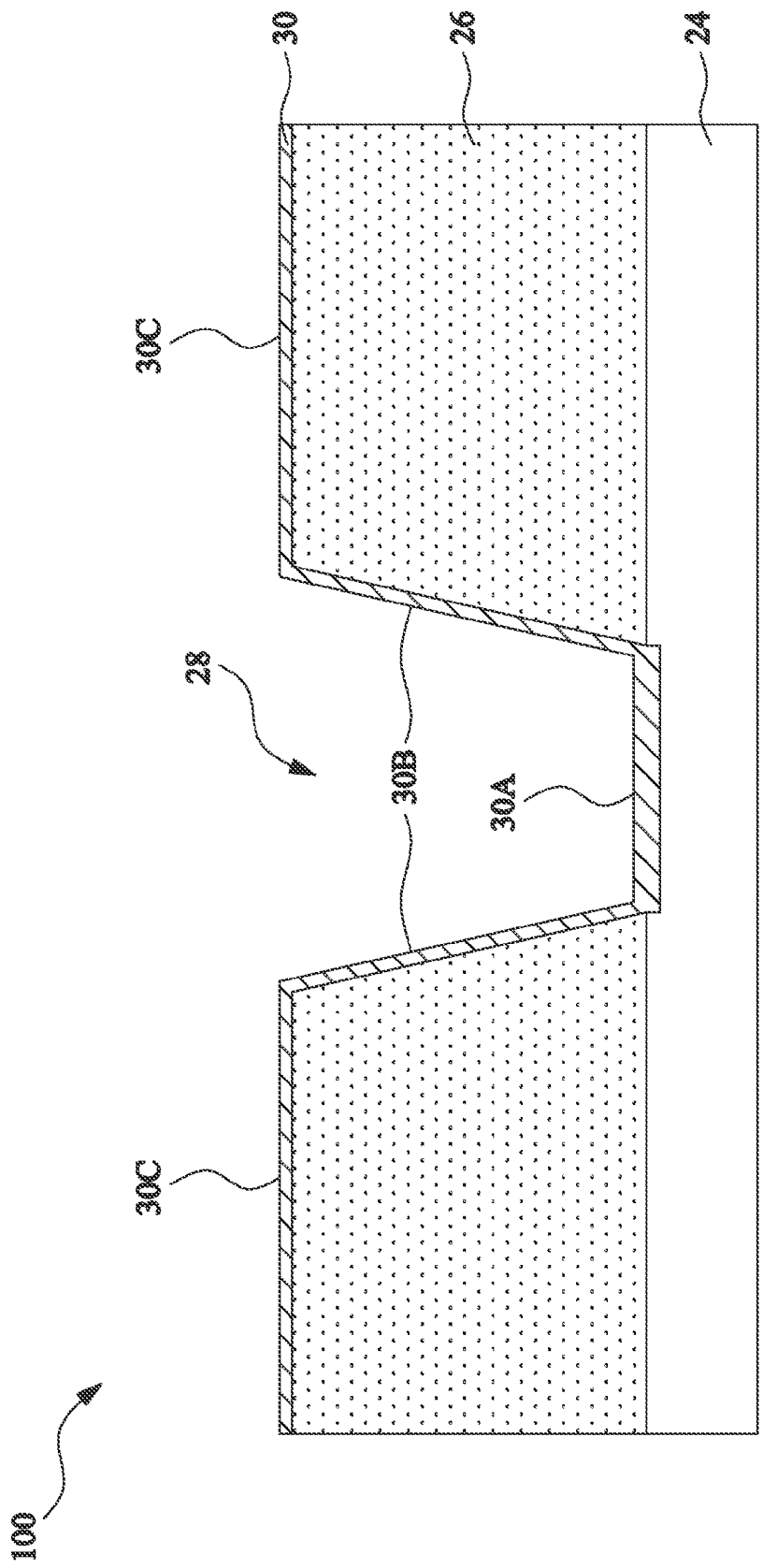

FIG. 2B illustrates forming a capping layer 30 over the dielectric layer 26 and the contact layer 24 and in the opening 28 (step 310). In some embodiments, the capping layer 30 will be substantially consumed by the subsequent process of forming the metal-silicide layer 40. The capping layer 30 can repair any damage to the contact layer 24 and the dielectric layer 26 caused by the etching of the opening 28. In addition, the capping layer 30 can increase the adhesion between the contact structure 50 (see FIG. 2G) and the dielectric layer 26.

The capping layer 30 may be formed of silicon, germanium, silicon germanium, silicon carbide, silicon phosphide, the like, or a combination thereof. In some embodiments, the capping layer 30 has a substantially same material composition as the contact layer. For example, in an embodiment where the contact layer 24 is formed of silicon germanium, the capping layer 30 is also formed of silicon germanium.

In an embodiment where the contact layer 24 is a part of an n-type metal-oxide-semiconductor field-effect transistor (NMOS), the capping layer 30 is made of silicon, silicon phosphide, silicon carbide, the like, or a combination thereof. In an embodiment where the contact layer 24 is a part of a p-type metal-oxide-semiconductor field-effect transistor (PMOS), the capping layer 30 is made of silicon, germanium, silicon germanium, the like, or a combination thereof. As illustrated in FIG. 2B, the capping layer 30 includes a portion 30A adjoining the contact layer 24, portions 30B extending along sidewalls of the opening 28 and adjoining the dielectric layer 26, and portions 30C extending over and adjoining the dielectric layer 26. In some embodiments, the capping layer 30 is formed by CVD, ALD, PVD, the like, or a combination thereof to a thickness from about 10 Å to about 200 Å. The capping layer 30 may be conformally deposited to have a substantially uniform thickness along the bottom and sidewalls of the opening 28 and over the dielectric layer 26.

Figure 2C:
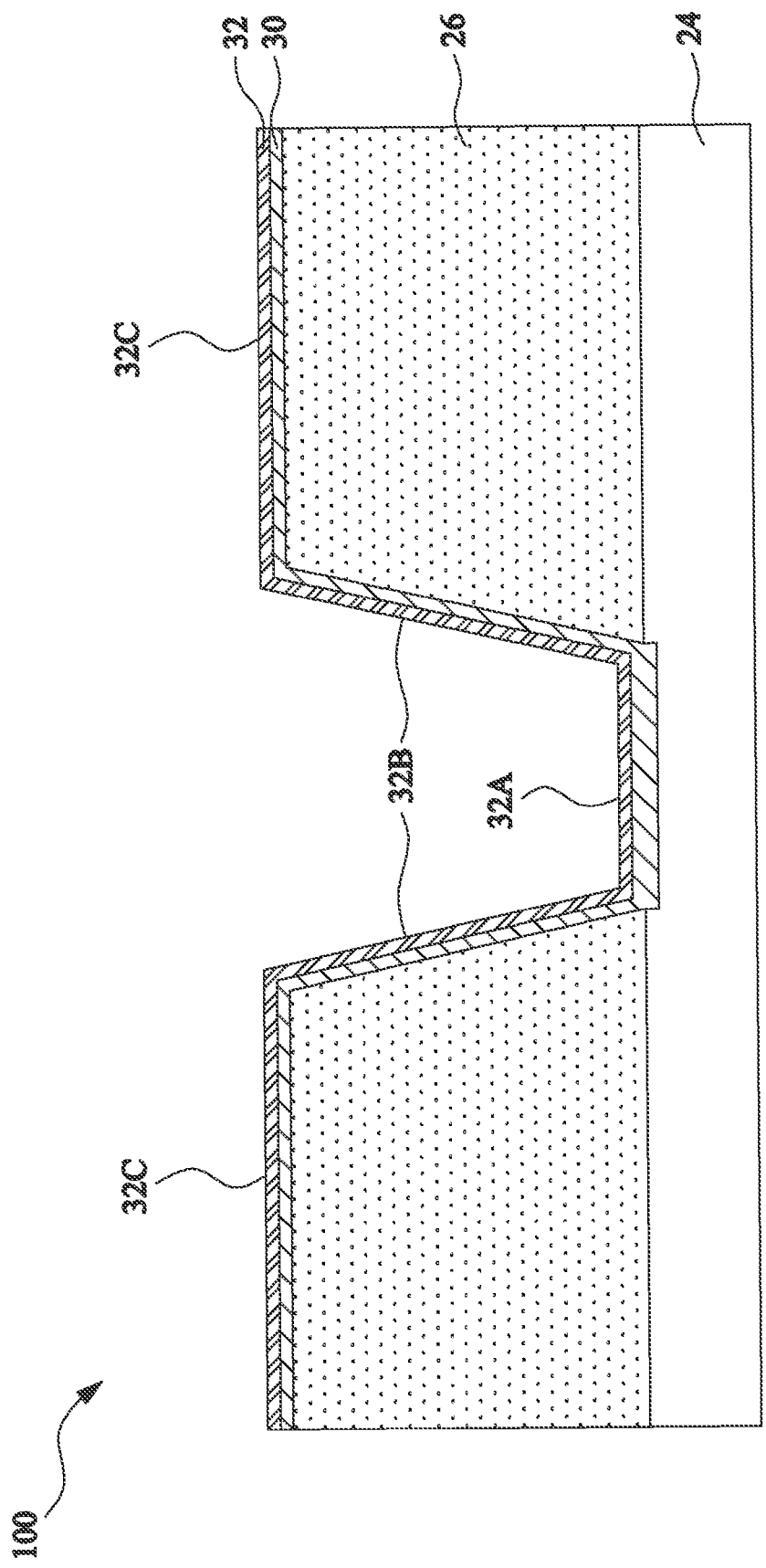

After the capping layer 30 is formed, the metal layer 32 is formed over the capping layer 30 and in the opening as illustrated in FIG. 2C (step 312). In some embodiments, the metal layer 32 will be substantially consumed by the subsequent process of forming the metal-silicide layer 40. The metal layer 32 may be formed of nickel, cobalt, titanium, tungsten, the like, or a combination thereof. As illustrated in FIG. 2C, the metal layer 32 includes a portion 32A at the bottom of the opening, portions 32B extending along sidewalls of the opening, and portions 32C extending over the dielectric layer 26. In some embodiments, the metal layer 32 is formed by PVD, ALD, sputter deposition, the like, or a combination thereof to a thickness from about 30 Å to about 300 Å. The metal layer 32 may be conformally deposited to have a substantially uniform thickness along the bottom and sidewalls of the opening and over the dielectric layer 26.

Figure 2D:
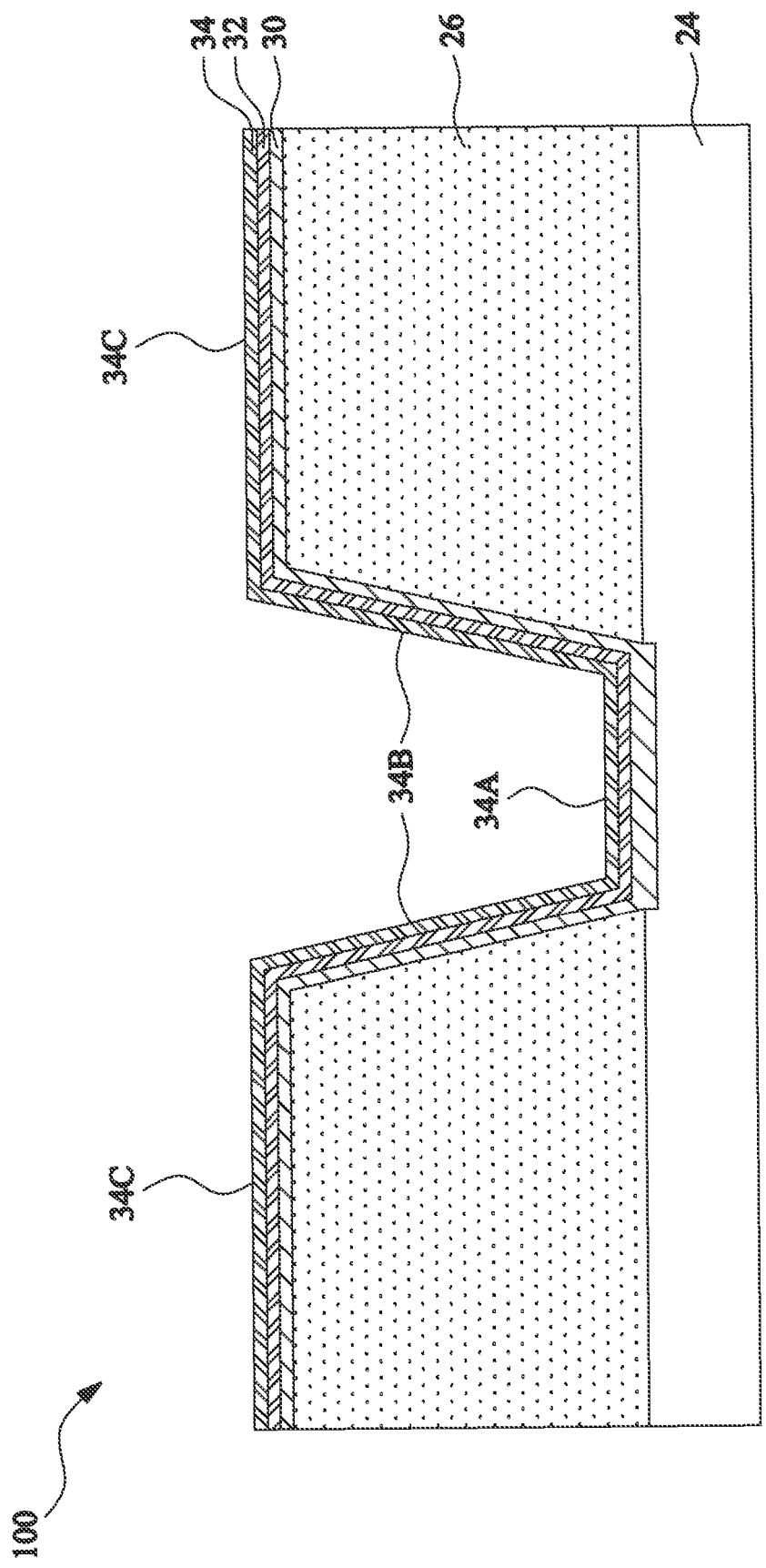

After the metal layer 32 is formed, the glue layer 34 is formed over the metal layer 32 and in the opening as illustrated in FIG. 2D (step 314). The glue layer 34 improves the adhesion between the subsequently formed conductive plug 42' (see FIG. 2G) and also prevents oxidation of the metal layer 32. The glue layer 34 may be formed of titanium nitride, tantalum nitride, the like, or a combination thereof. As illustrated in FIG. 2D, the glue layer 34 includes a portion 34A at the bottom of the opening, portions 34B extending along sidewalls of the opening, and portions 34C extending over the dielectric layer 26. In some embodiments, the glue layer 34 is formed by CVD, PVD, ALD, the like, or a combination thereof to a thickness from about 5 Å to about 50 Å. The glue layer 34 may be conformally deposited to have a substantially uniform thickness along the bottom and sidewalls of the opening and over the dielectric layer 26.

Figure 2E:
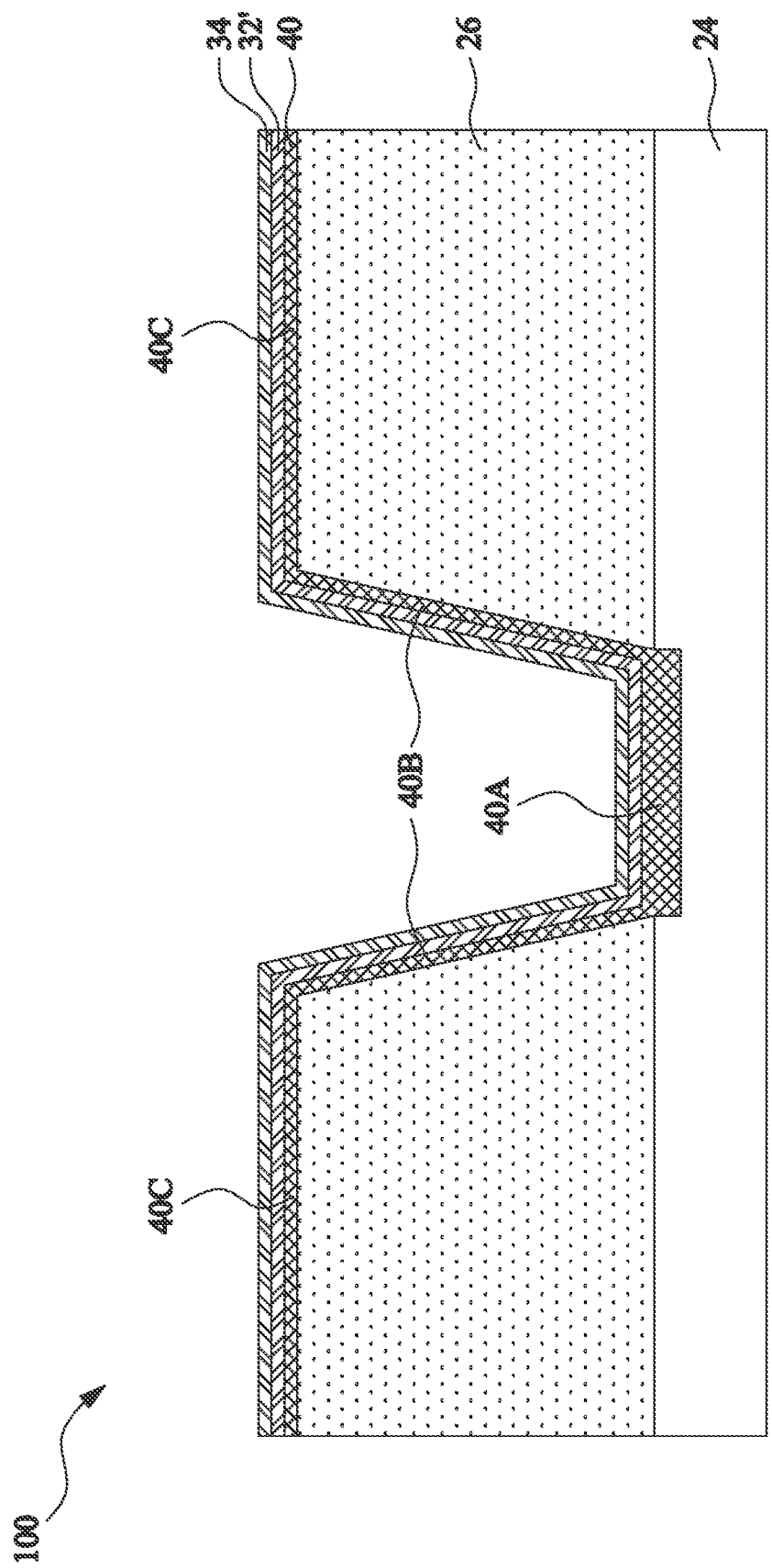

FIG. 2E illustrates the silicidation process to form the metal-silicide layer 40 from the capping layer 30 and the metal layer 32 (step 316). The formation of the metal-silicide layer 40 includes performing an annealing process on the semiconductor device 100. The annealing process causes the capping layer 30 to react with the metal layer 32 to form the metal-silicide layer 40. In some embodiments, the annealing process is performed using thermal soaking, spike annealing, flash annealing, laser annealing, the like, or a combination thereof. In some embodiments, the annealing process is performed at a temperature from about 100° C. to about 900° C., in an atmosphere including process gases such as Ar, $N_2$, the like, or a combination thereof, and at a pressure from 770 Torr to about 1000 Torr.

After the metal-silicide layer 40 is formed, in some embodiments, there remains an unreacted metal layer 32' that was not converted into the metal-silicide layer 40. As illustrated in FIG. 2E, the metal-silicide layer 40 includes a portion 40A at the bottom of the opening and adjoining the contact layer 24, portions 40B extending along sidewalls of the opening and adjoining the dielectric layer 26, and portions 40C extending over and adjoining the dielectric layer 26. In some embodiments, the bottom portion 40A of the metal-silicide layer 40 has a thickness from about 30 Å to about 300 Å, and the sidewall portions 40B of the metal-silicide layer 40 has a thickness from about 3 Å to about 30 Å.

Figure 2F:
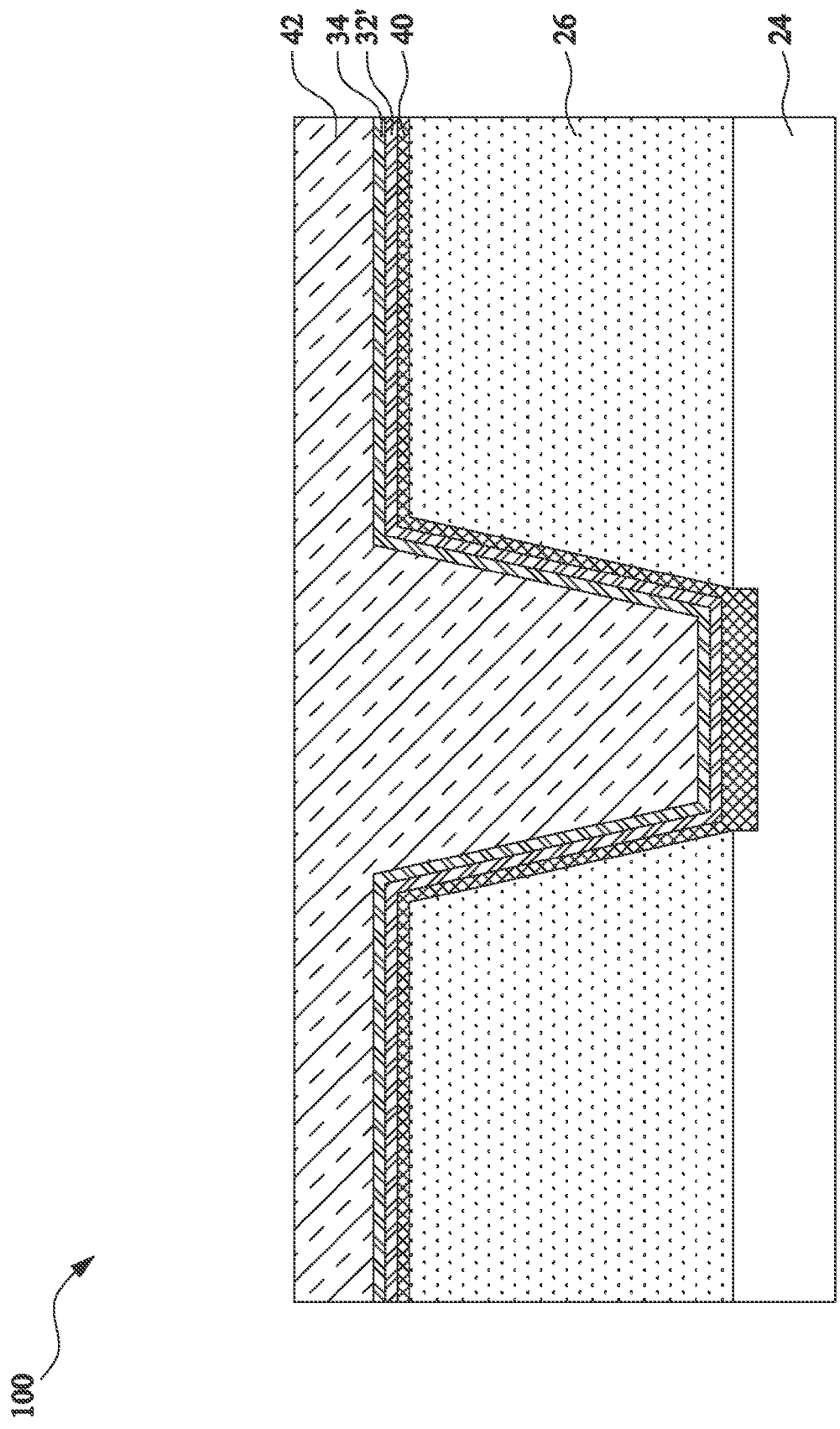

FIG. 2F illustrates filling the opening in the dielectric layer 26 with the conductive material 42 (step 318). In some embodiments, the conductive material 42 fills the opening and also extends over the dielectric layer 26. The conductive material 42 will form the subsequently formed conductive plug 42' (see FIG. 2G). In some embodiments, the conductive material 42 is formed of tungsten. In alternative embodiments, the conductive material 42 includes other metal(s) or metal alloys such as aluminum, copper, titanium nitride, tantalum nitride, the like, or a combination thereof. The formation of the conductive material may be performed using CVD, ALD, PVD, sputtering, the like, or a combination thereof.

Figure 2G:
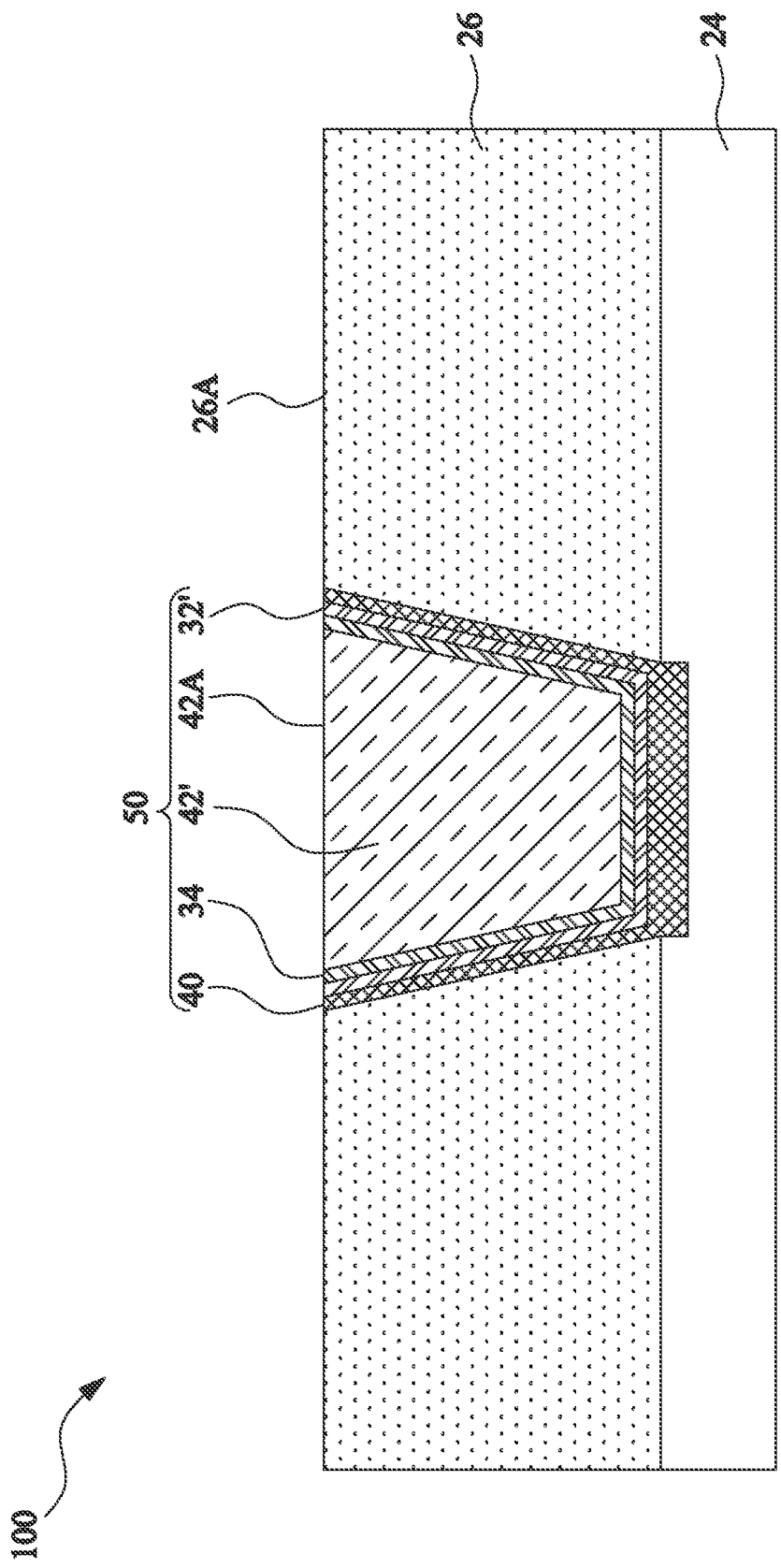

In the embodiments where the conductive material 42 extends over the dielectric layer 26, a planarization process may be performed on the conductive material 42 to form the conductive plug 42' as illustrated in FIG. 2G (step 320). In some embodiments, the planarization process is a chemical mechanical polishing (CMP) process, an etching process, the like, or a combination thereof. After the planarization process, the top surface 42A of the conductive plug 42' is substantially coplanar with the top surface 26A of the dielectric layer 26. As illustrated in FIG. 2G, the metal-silicide layer 40, the unreacted metal layer 32' (if present), the glue layer 34, and the conductive plug 42' forms the contact structure 50.

Figure 3:
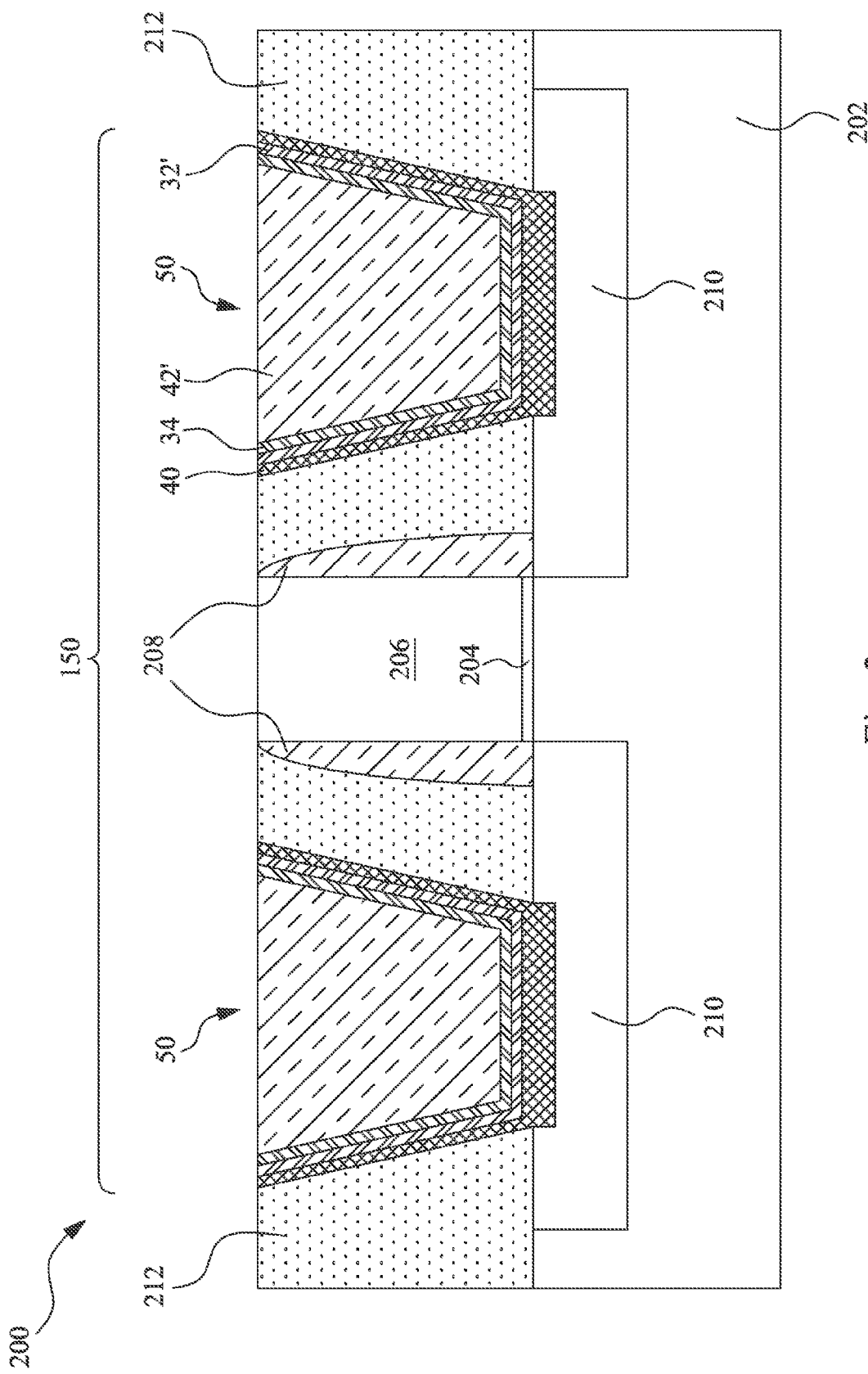
FIG. 3 illustrates a cross-sectional view of another semiconductor device in accordance with some embodiments.

FIG. 3 illustrates a cross-sectional view of a semiconductor device 200 in accordance with some embodiments. The semiconductor device 200 includes an active device 150 formed on a substrate 202. In the illustrated embodiment, the active device 150 is a transistor, although other embodiments may include various other active and passive devices such as resistors, capacitors, inductors, diodes, varactors, the like, or a combination thereof. In an embodiment, the active device 150 is a fin field-effect transistor (FinFET).

The substrate 202 may be a part of a wafer and may include a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 202 may comprise a SOI substrate. Generally, an SOI substrate comprises a layer of a semiconductor material such as epitaxial silicon, germanium, silicon germanium, SOI, SGOI, or combinations thereof. The substrate 202 may be doped with a p-type dopant, such as boron, aluminum, gallium, or the like, although the substrate may alternatively be doped with an n-type dopant, as is known in the art. Only a portion of the substrate 202 is illustrated in the figures, as this is sufficient to fully describe this illustrative embodiment. In some embodiments, the substrate 202 is a semiconductor fin extending from a substrate.

The active device 150 includes source/drain regions 210, a gate dielectric 204, a gate electrode 206, gate spacers 208, a dielectric layer 212, and contact structures 50. The formation of the active device 150 may begin with the formation of a gate dielectric layer (not shown) and a gate electrode layer (not shown). The gate dielectric layer may be formed by thermal oxidation, CVD, sputtering, or any other suitable methods for forming a gate dielectric. In other embodiments, the gate dielectric layer includes dielectric materials having a high dielectric constant (k value), for example, greater than 3.9. The materials may include silicon nitrides, oxynitrides, metal oxides such as $HfO_2$, $HfZrO_x$, $HfSiO_x$, $HfTiO_x$, $HfAlO_x$, and the like, and combinations and multi-layers thereof. In another embodiment, the gate dielectric layer may have a capping layer selected from metal nitride materials such as titanium nitride, tantalum nitride, or molybdenum nitride.

The gate electrode layer (not shown) may be formed over the gate dielectric layer. The gate electrode layer may include a conductive material and may be selected from a group comprising of polycrystalline-silicon (poly-Si), polycrystalline silicon-germanium (poly-SiGe), metal-nitrides, metal-silicides, metal-oxides, and metals. Examples of metal-nitrides include tungsten nitride, molybdenum nitride, titanium nitride, and tantalum nitride, the like, or a combination thereof. Examples of metal-silicides include tungsten silicide, titanium silicide, cobalt silicide, nickel silicide, platinum silicide, erbium silicide, the like, or a combination thereof. Examples of metal-oxides include ruthenium oxide, indium tin oxide, the like, or a combination thereof. Examples of metals include tungsten, titanium, aluminum, copper, molybdenum, nickel, platinum, the like, or a combination thereof.

The gate electrode layer may be deposited by CVD, sputter deposition, or other suitable techniques for depositing conductive materials. The thickness of the gate electrode layer may be in the range of about 200 Å to about 4,000 Å. The top surface of the gate electrode layer usually has a non-planar top surface, and may be planarized, for example by a CMP process; prior to patterning of the gate electrode layer or gate etch. Ions may or may not be introduced into the gate electrode layer at this point, for example, by ion implantation techniques.

After the gate electrode layer is formed, the gate electrode layer and the gate dielectric layer may be patterned to form the gate electrode 206 and the gate dielectric 204. The gate patterning process may include depositing and patterning a gate mask (not shown) on the gate electrode layer using acceptable deposition and photolithography techniques. The gate mask may incorporate commonly used masking materials, such as (but not limited to) photoresist material, silicon oxide, silicon oxynitride, and/or silicon nitride. The gate electrode layer and the gate dielectric layer may be etched using plasma etching to form the gate electrode 206 and the gate dielectric 204 as illustrated in FIG. 3.

After the gate electrode 206 and the gate dielectric 204 are formed, the source/drain regions 210 may be formed. The source/drain regions 210 may be formed by doping portions of the substrate 202 with an implantation process to implant appropriate dopants to complement the dopants in the substrate 202. In an embodiment where the substrate 202 is implanted with p-type dopants such as boron, gallium, indium, or the like, the source/drain regions 210 are implanted with n-type dopants such as phosphorous, arsenic, antimony, or the like. The source/drain regions 210 may be implanted using the gate electrode 206 as a mask. In some embodiments, the doped source/drain regions 210 may be annealed to promote diffusion of the dopant impurities into the substrate 202.

In another embodiment, the source/drain regions 210 may be formed by forming recesses (not shown) in substrate 202 and epitaxially growing material in the recesses. In an embodiment, the recesses may be formed by an anisotropic etch. Alternatively, the recesses may be formed by an isotropic orientation dependent etching process, wherein tetramethylammonium hydroxide (TMAH) or the like may be used as an etchant. After the recesses are formed, the source/drain regions 210 may be formed by epitaxially growing material in the recesses. During the epitaxy process, etching gas, such as HCl gas, may be added (as an etching gas) into the process gas, so that the source/drain regions 210 are selectively grown in the recesses, but not on the gate electrode 206. In alternative embodiments, no etching gas is added, or the amount of etching gas is small, so that there is a thin layer of the source/drain regions 210 formed on the substrate 202 and the gate electrode 206. In yet another embodiment, the gate electrode 206 and the substrate 202 could be covered with a sacrificial layer (not shown) to prevent epitaxial growth thereon. The source/drain regions 210 may be doped either through an implantation method as discussed above, or else by in-situ doping as the material is grown.

The formation methods of the source/drain regions 210 may include ALD, CVD, such as a reduced pressure CVD (RPCVD), metalorganic chemical vapor deposition (MOCVD), or other applicable methods. Depending on the desirable composition of the source/drain regions 210, the precursors for the epitaxial growth may include $SiH_4$, $GeH_4$, $CH_3$, $PH_3$, and/or the like, and the partial pressures of the Si-containing gases, Ge-containing gases, C-containing gases, and P-containing gases are adjusted to modify the atomic ratio of germanium/carbon/phosphorous to silicon.

In some embodiments the source/drain regions 210 are formed so as to impart a strain on the channel region underneath the gate electrode 206. In an embodiment where the substrate 202 is formed of silicon, the source/drain regions 210 may then be formed through a selective epitaxial growth (SEG) process with a material, such as silicon germanium, silicon carbon, or the like that has a different lattice constant than the silicon. The lattice mismatch between the stressor material in the source/drain regions 210 and the channel region formed underneath the gate electrode 206 will impart a stress into the channel region that will increase the carrier mobility and the overall performance of the device. The source/drain regions 210 may be doped either through an implantation method as discussed above, or else by in-situ doping as the material is grown.

The gate spacers 208 may be formed by blanket depositing a spacer layer (not shown) over the gate electrode 206 and the substrate 202. The spacer layer may comprise of SiN, oxynitride, SiC, SiON, oxide, and the like and may be formed by methods utilized to form such a layer, such as CVD, plasma enhanced CVD, sputtering deposition, the like, or a combination thereof. The gate spacers 208 are then patterned, preferably by anisotropically etching to remove the spacer layer from the horizontal surfaces of the gate electrode 206 and the substrate 202.

In some embodiments, the source/drain regions 210 include lightly doped regions (not shown) and heavily doped regions. In this embodiment, before the gate spacers 208 are formed, the source/drain regions 210 may be lightly doped. After the gate spacers 208 are formed, the source/drain regions 210 may then be heavily doped. This forms lightly doped regions and heavily doped regions. The lightly doped regions are primarily underneath the gate spacers 208 while the heavily doped regions are outside of the gate spacers 208 along the substrate 202.

After the formation of the gate electrode 206, the source/drains 210, and the gate spacers 208, the dielectric layer 212 is formed. The dielectric layer 212 may be formed of oxides such as silicon oxide, BPSG, USG, FSG, low-k dielectrics such as carbon doped oxides, extremely low-k dielectrics such as porous carbon doped silicon dioxide, a polymer such as polyimide, the like, or a combination thereof. The low-k dielectric materials may have k values lower than 3.9. The dielectric layer 26 may be deposited by CVD, PVD, ALD, an SOD process, the like, or a combination thereof. The dielectric layer 212 may also be referred to as ILD 212.

After the dielectric layer 212 is formed, openings (not shown) are formed through the dielectric layer 212 to expose a portion of the source/drains 210. The openings may be formed using acceptable photolithography and etching techniques such as, for example, an anisotropic dry etch.

After the openings are formed in the dielectric layer 212, the contact structures 50 are formed in the openings. The contact structures 50 are formed in a similar manner as described above in FIGS. 2A through 2G and the description is not repeated herein. The contact structures 50 electrically couple the source/drain regions 210 to overlying structures (not shown) such as conductive lines/vias and/or other active and passive devices. For example, an interconnect structure include alternating layers of dielectric material and conductive material may be formed over the contact structures 50 and the dielectric layer 212. The contact structures 50 can electrically couple the source/drain regions 210 to this interconnect structure.

According to embodiments of the present disclosure, advantages include a low resistance silicide contact with improved process stability. In particular, the present disclosure forms the silicide in the contact opening after the contact opening is formed rather than forming the silicide before the contact is formed. In this process, a capping layer is formed inside the contact opening and a metal layer is formed over the capping layer. These layers are then annealed to form the silicide layer. By forming the capping layer after the contact opening is formed, the capping layer properties are not affected by the contact opening etching process, the dielectric layer formation, or any other processes performed before the capping layer formation. This improves the processing window for the capping layer formation and also improves the process stability for the contact formation. In addition, the capping layer can repair damage caused by the etching of the contact opening.

An embodiment is a method of forming a semiconductor device, the method including forming a contact region over a substrate, forming a dielectric layer over the contact region and the substrate, and forming an opening through the dielectric layer to expose a portion of the contact region. The method further includes forming a metal-silicide layer on the exposed portion of the contact region and along sidewalls of the opening, and filling the opening with a conductive material to form a conductive plug in the dielectric layer, the conductive plug being electrically coupled to the contact region.

Another embodiment is method of forming a contact structure, the method including forming a contact layer over a substrate, depositing a dielectric layer over the contact layer and the substrate, patterning the dielectric layer to form an opening through the dielectric layer, at least a portion of the contact layer being exposed in the opening, and depositing a capping layer in the opening along the exposed contact layer and sidewalls of the dielectric layer and over the dielectric layer. The method further includes depositing a metal layer on the capping layer in the opening and over the dielectric layer, depositing a glue layer on the metal layer in the opening and over the dielectric layer, and after depositing the glue layer, annealing the capping layer and the metal layer to form a metal-silicide layer in the opening along the contact layer and the sidewalls of the dielectric layer and over the dielectric layer.

A further embodiment is a method of forming a contact structure, the method including forming a contact region in a substrate, forming a dielectric layer over the contact region, forming an opening in the dielectric layer to expose at least a surface of the contact region, and conformally depositing a silicon-containing capping layer along the exposed surface of the contact region and sidewalls of the opening. The method further includes conformally depositing a metal layer on the silicon-containing capping in the opening, conformally depositing a glue layer on the metal layer in the opening, and annealing the silicon-containing capping layer and the metal layer to form a metal-silicide layer in the opening along the contact region and the sidewalls of the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
   forming a contact region over a substrate;
   forming a dielectric layer over the contact region and the substrate;
   forming an opening through the dielectric layer to expose a portion of the contact region;
   forming a metal-silicide layer on the exposed portion of the contact region and along sidewalls of the opening, wherein the forming the metal-silicide layer comprises:
      forming a silicon-containing capping layer along the exposed portion of the contact region, the sidewalls of the opening, and over the dielectric layer;
      forming a metal layer over the silicon-containing capping layer in the opening and over the dielectric layer;
      forming a glue layer over the metal layer in the opening and over the dielectric layer; and
      performing a silicidation process to react at least portions of the silicon-containing capping layer and the metal layer to form the metal-silicide layer; and
   filling the remaining portion of the opening over the glue layer and the metal-silicide layer with a conductive material to form a conductive plug in the dielectric layer, the conductive plug being electrically coupled to the contact region.

2. The method of claim 1, wherein the forming the silicon-containing capping layer comprises silicon, germanium, silicon germanium, silicon carbide, silicon phosphide, or a combination thereof.

3. The method of claim 1, wherein the metal layer comprises nickel, cobalt, titanium, tungsten, or a combination thereof.

4. The method of claim 1, wherein the glue layer comprises titanium nitride, tantalum nitride, or a combination thereof.

5. The method of claim 1, wherein the performing the silicidation process comprises:
   performing an annealing process on the substrate at temperature from about 100° C. to about 900° C. with process gases including Ar, $N_2$, or a combination thereof and at a pressure from 770 Torr to about 1000 Torr.

6. The method of claim 1, wherein the forming the metal-silicide layer on the exposed portion of the contact region and along the sidewalls of the opening consumes at least a portion of the contact region.

7. The method of claim 1 further comprising:
planarizing the conductive material to form the conductive plug, wherein after the planarizing step a top surface of the conductive plug is substantially coplanar with a top surface of the dielectric layer.

8. The method of claim 1, where the substrate is a semiconductor fin for a fin field-effect transistor (FinFET) and the contact region is a source/drain region for the FinFET, and wherein the forming the contact region comprises:
etching a recess in semiconductor fin;
epitaxially growing a semiconductor material in the recess; and
doping the semiconductor material with at least one dopant to form a source/drain region.

9. The method of claim 1, wherein the contact region comprises silicon, silicon germanium, silicon phosphide, silicon carbide, or a combination thereof.

10. The method of claim 1, wherein the metal-silicide layer extends along substantially the sidewalls of the opening from a top surface of the contact region to a top surface of the dielectric layer.

11. The method of claim 1, wherein the metal-silicide layer has a first thickness along the contact region and a second thickness along the sidewalls of the opening, the first thickness being from about 30 Angstroms (Å) to about 300 Å and the second thickness being from about 3 Å to about 30 Å.

12. The method of claim 1, wherein the glue layer is formed after the metal layer.

13. A method of forming a contact structure, the method comprising:
forming a contact layer over a substrate;
depositing a dielectric layer over the contact layer and the substrate;
patterning the dielectric layer to form an opening through the dielectric layer, at least a portion of the contact layer being exposed in the opening;
depositing a capping layer in the opening along the exposed contact layer and sidewalls of the dielectric layer and over the dielectric layer;
depositing a metal layer over the capping layer in the opening and over the dielectric layer;
depositing a glue layer over the metal layer in the opening and over the dielectric layer;
after depositing the glue layer, annealing the capping layer and the metal layer to form a metal-silicide layer in the opening along the contact layer and the sidewalls of the dielectric layer and over the dielectric layer; and
after forming the metal-silicide layer, filling a conductive material on the glue layer in the opening and over the dielectric layer.

14. The method of claim 13 further comprising:
performing a planarization process to forming a conductive plug in the dielectric layer, the planarization process removing the conductive material, the glue layer, and metal-silicide layer over the dielectric layer.

15. The method of claim 13, wherein after the annealing the capping layer and the metal layer to form the metal-silicide layer, a portion of the metal layer remains unreacted and is interposed between the metal-silicide layer and the glue layer.

16. The method of claim 15, wherein the portion of the metal layer remaining unreacted has a thickness from about 3 Angstroms (Å) to about 30 Å.

17. The method of claim 13, wherein the capping layer has a substantially same material composition as the contact layer.

18. A method of forming a contact structure, the method comprising:
forming a contact region in a substrate;
forming a dielectric layer over the contact region;
forming an opening in the dielectric layer to expose at least a surface of the contact region;
conformally depositing a silicon-containing capping layer along the exposed surface of the contact region and sidewalls of the opening;
conformally depositing a metal layer over the silicon-containing capping layer in the opening;
conformally depositing a glue layer over the metal layer in the opening;
annealing the silicon-containing capping layer and the metal layer to form a metal-silicide layer in the opening along the contact region and the sidewalls of the dielectric layer; and
after forming the metal-silicide layer, filling a conductive material in the opening over the glue layer and over the dielectric layer.

19. The method of claim 18, wherein the step of annealing the silicon-containing capping layer and the metal layer is performed after the step of conformally depositing a glue layer on the metal layer in the opening.

20. The method of claim 18, wherein the metal-silicide layer has a surface extending below a top surface of the contact region.

* * * * *